US006363293B1

(12) United States Patent
Kinnaird

(10) Patent No.: US 6,363,293 B1
(45) Date of Patent: Mar. 26, 2002

(54) VIDEO WIRE BONDED SYSTEM AND METHOD OF OPERATION

(75) Inventor: Clark D. Kinnaird, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/198,192

(22) Filed: Nov. 23, 1998

Related U.S. Application Data

(60) Provisional application No. 60/070,389, filed on Jan. 5, 1998.

(51) Int. Cl.[7] .............................................. G06F 19/00
(52) U.S. Cl. ...................................... 700/121; 438/617
(58) Field of Search .......................... 700/121; 438/617; 716/15; 29/840, 843

(56) References Cited

U.S. PATENT DOCUMENTS 5,125,036 A  * 6/1992 Raghavan et al. .......... 382/146
5,516,023 A  * 5/1996 Kono ......................... 228/4.5
5,581,632 A  * 12/1996 Koljonen et al. ........... 382/150
5,901,241 A  * 5/1999 Koljonen et al. ........... 382/150

* cited by examiner

Primary Examiner—Paul P. Gordon
(74) Attorney, Agent, or Firm—Gary C. Honeycutt; Fred Telecky; Arthur I. Navarro

(57) ABSTRACT

A video wire bonder system includes a processor (12) coupled to an imaging station (14), an input device (16), a display (18), and a memory (20). Processor (12) generates an image overlay (30) having a graphical representation of each video wire bond between a bonding pad (34) of a semiconductor die (21) and a lead finger (35) of an associated lead frame (22). Processor (12) generates a template (28) comprising an organization of video wire bond parameters associated with each video wire bond, and stores template (28) in memory (20). Display (18) displays image overlay (30) to provide visual feedback to an operator while the operator is programming template (28).

20 Claims, 3 Drawing Sheets

| WIRE NUMBER | PAD COORDINATES (MICRONS) | | | FINGER COORDINATES (MICRONS) | | | BONDING SEQUENCE | WIRE CLEARANCE PARAMETERS |
|---|---|---|---|---|---|---|---|---|
| | X | Y | Z | X | Y | Z | | |
| 1 | 120.0 | 154.5 | 50.4 | 20.2 | 275.4 | 55.6 | 3 | ○ ○ ○ |
| 2 | 120.0 | 125.5 | 50.4 | 100.3 | 20.9 | 56.1 | 1 | ○ ○ ○ |
| 3 | 125.3 | 126.0 | 50.5 | 175.4 | 20.9 | 55.9 | 2 | ○ ○ ○ |
| 4 | 145.6 | 137.0 | 51.0 | 270.3 | 149.2 | 55.8 | 4 | ○ ○ ○ |
| ○ ○ ○ | ○ ○ ○ | ○ ○ ○ | ○ ○ ○ | ○ ○ ○ | ○ ○ ○ | ○ ○ ○ | ○ ○ ○ | ○ ○ ○ |

FIG. 3

VIDEO WIRE BONDED SYSTEM AND METHOD OF OPERATION

This application claims priority under 35 USC §119 (e)(1) of provisional application No. 60/070,389, filed Jan. 5, 1998.

TECHNICAL FIELD OF THE INVENTION

This invention relates in general to electronic devices, and more particularly to a video wire bonder system and method of operation.

BACKGROUND OF THE INVENTION

Many semiconductor chip manufacturing devices require a template of wire bond coordinates to reference during fabrication. The process of programming the coordinates of each wire bond endpoint in the template can be laborious and expensive. On devices with many input and output leads, the semiconductor die pads and lead fingers which define the endpoints of each wire bond look essentially the same. Also, the video magnification required to program each endpoint limits the operator's field of view, so the operator repositions the video magnifier for each specified endpoint. Therefore, it is difficult for the operator to distinguish between endpoints that have already been programmed and those that have not.

One approach physically bonds a wire from a semiconductor die pad to a lead finger of an associated lead frame while programming the coordinates of each endpoint. This approach consumes a semiconductor die, lead frame, and bond wire in the initial programming process and each time the template is edited. Furthermore, any errors or desired adjustments during bonding requires a reprogramming of the template. Another approach identifies previously programmed endpoints in the field of view with a video cross hair but fails to illustrate the wire unless an actual wire is physically bonded. These approaches fail to provide an operator with simultaneous feedback regarding the accuracy and integrity of each wire bond, without the time, cost, and complexity of physically bonding the wires.

SUMMARY OF THE INVENTION

In accordance with the present invention, a video wire bonder system is provided which substantially eliminates or reduces disadvantages and problems associated with previous wire bonder systems.

In accordance with one embodiment of the present invention, a system for programming a wire bonder includes a memory that stores an image of a semiconductor die and an associated lead frame. An input device specifies a wire bond between the semiconductor die and the associated lead frame. A processor coupled to the memory and the input device generates an image overlay having a graphical representation of the wire bond, the semiconductor die, and the associated lead frame. A display coupled to the processor displays the image overlay.

Another embodiment of the present invention is a method for programming a wire bonder, wherein the method includes receiving an image of a semiconductor die and an associated lead frame. The method further includes specifying a wire bond between the semiconductor die and the associated lead frame. The method further includes generating an image overlay having a graphical representation of the wire bond, the semiconductor die, and the associated lead frame. The method concludes by displaying the image overlay.

Technical advantages of the present invention include a video wire bonder system that graphically represents a video wire bond between a bonding pad of a semiconductor die and a lead finger of an associated lead frame. In addition, the system displays a graphical representation of various video wire bond parameters in an image overlay and stores these parameters in a template. Details of the image overlay indicate the wire bond sequencing data, wire positioning coordinates, the contour of each wire, the available distance between neighboring wires, wire identification data, and other suitable parameters. The image overlay further depicts characteristics of a particular bonding tool, such as calibration parameters and bonding tool contour parameters.

The video wire bonder of the present invention provides an operator with visual feedback regarding the accuracy and integrity of each video wire bond while the operator programs the template. As a result, an operator need not program an entire template prior to analyzing it and discovering any potential manufacturing defects. Furthermore, the video wire bonder system of the present invention allows the operator to edit any incorrect video wire bonds without wasting valuable resources because an operator can program the template without physically bonding any wires between a semiconductor die and an associated lead frame.

BRIEF DESCRIPTION OF THE DRAWINGS

For a more complete understanding of the present invention and its advantages, reference is now made to the following description taken in conjunction with the accompanying drawings, in which like reference numbers indicate like features and wherein:

FIG. 3 illustrates a template of video wire bond parameters generated by the video wire bonder system.

DETAILED DESCRIPTION OF THE INVENTION

Figure 1:
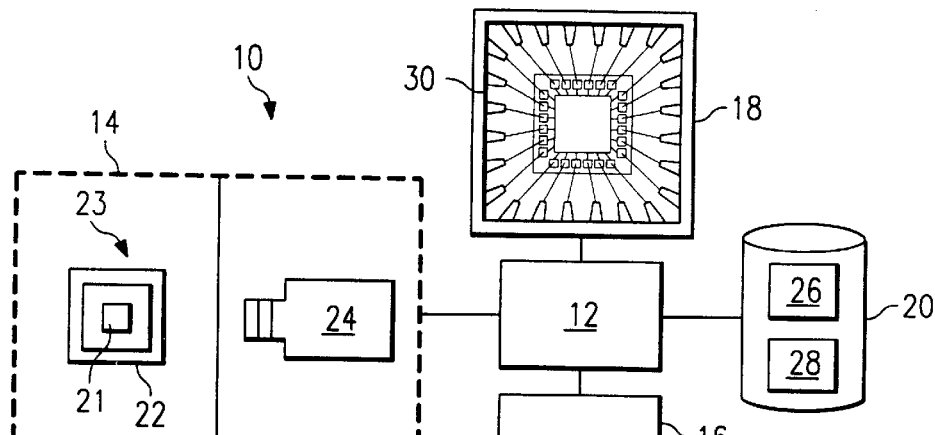
FIG. 1 illustrates a block diagram of a video wire bonder system in accordance with the present invention.

FIG. 1 illustrates a block diagram of a video wire bonder system 10 that includes a processor 12 coupled to an imaging station 14, an input device 16, a display 18 and a memory 20. In general, system 10 visually represents the process of bonding wires between a semiconductor die 21 and an associated lead frame 22 to generate a template 28 of a wire-bonded semiconductor chip.

Processor 12 may comprise a central processing unit associated with a computer system, such as a mainframe, a workstation, or another suitable general purpose data processing facility. In general, processor 12 controls the operation of system 10.

Imaging station 14 includes a semiconductor device 23 loaded into an imaging device 24 of a semiconductor chip manufacturing device. Semiconductor device 23 includes semiconductor die pad 21 and associated lead frame 22 prior to wire bonding, encapsulation, or other processes associated with fabricating a semiconductor chip. Imaging device 24 includes a camera or other suitable imaging apparatus. Physically loading semiconductor device 23 into a semiconductor chip manufacturing device allows an operator to program template 28 under realistic manufacturing conditions that account for a variety of factors, including but not limited to, individual characteristics of each manufacturing device and dimension variations of pad 21 and lead frame 22 due to heat or other external factors. In a particular embodiment, components of system 10 are integral to a wire bonding tool for fabricating an actual wire-bonded semiconductor chip patterned after template 28. Imaging device 24 is positioned to calibrate system 10 with the bonding tool. Calibrating system 10 with the bonding tool increases the accuracy of template 28.

Input device 16 may comprise a keyboard and mouse, track ball, or other suitable input device. In one embodiment, input device 16 includes an input interface suitable to process automated instructions. Display 18 may comprise a cathode ray tube display, a liquid crystal display, or other suitable output device.

Memory 20 may comprise a file, stack, or other suitable organization of volatile or non-volatile memory that includes an image 26 of semiconductor device 23, and template 28. In one embodiment, image 26 includes a digitally scanned image of the bonding pads of a semiconductor die 21 and the lead fingers of an associated lead frame 22. Template 28 may comprise a table, chart, or other suitable organization of information that a manufacturing device references during physical wire bonding.

Template 28 includes wire positioning coordinates and wire identification data associated with each video wire bond between semiconductor die 21 and associated lead frame 22. A wire positioning coordinate (x,y,z) indicates the location of each selected endpoint of a video wire bond. Wire identification data indicate distinguishing characteristics of a selected wire, such as its wire number, name, shape, and contour. Template 28 may also include information regarding the particular sequence in which a series of wires are connected between selected endpoints on semiconductor device 23 (bonding sequence parameters); the shape or contour of a particular path that a video wire bond takes between selected endpoints and associated positioning coordinates (wire clearance parameters); the particular bond a wire has with a particular bonding pad or lead finger (endpoint bond parameters); or other suitable parameters.

In operation, imaging device 24 captures image 26 of semiconductor chip 23 for which a manufacturing template 28 is desired. Image 26 provides a visual chip topology for an operator to reference on display 20 while programming template 28. Due to the precise mounting of imaging device 24 in the semiconductor chip manufacturing device and the loading of semiconductor device 23 in device 24, image 26 provides chip configuration data, such as bonding pad coordinates and lead finger coordinates, to processor 12. These coordinates aid in calibrating system 10. Imaging device 24 may magnify image 26 of semiconductor device 23 as well as pan the landscape of semiconductor device 23.

Input device 16 receives instructions associated with video bonding a wire between a selected bonding pad of semiconductor die 21 and a selected lead finger of associated lead frame 22. Device 16 generates wire positioning coordinates and wire identification data specifying each video wire bond between these endpoints. For example, to program a video wire bond, an operator manipulates input device 16 to select a first endpoint on semiconductor die 21. Thereafter, the operator drags a mouse, maneuvers a trackball, or in some other way manipulates input device 16 to select a second endpoint on lead frame 22. Together, this selected pair of endpoints specifies a video wire bond.

An operator may also specify the particular sequence in which a series of wires are bonded between selected endpoints on semiconductor device 23 (bonding sequence parameters); the shape or contour of a particular path that a video wire bond takes between selected endpoints and associated positioning coordinates (wire clearance parameters); the particular bond a wire has with a particular bonding pad or lead finger (endpoint bond parameters); or other suitable parameters. Device 16 provides the wire positioning coordinates, the wire identification data, the bonding sequence parameters, the wire clearance parameters, the endpoint bond parameters, and other suitable parameters, collectively referred to as "video wire bond parameters", to processor 12.

Processor 12 receives the video wire bond parameters from input device 16, and generates an image overlay 30 for display on device 18. Image overlay 30 comprises a graphical representation of the video wire bond parameters programmed by the operator in combination with image 26 of device 23 viewed by device 24. For example, image overlay 30 includes a graphical representation of each video wire bond specified by the operator between a bonding pad of a semiconductor die 21 and a lead finger of an associated lead frame 22.

In one embodiment, image overlay 30 includes a graphical representation of other video wire bond parameters such as bonding sequence parameters, wire clearance parameters, wire identification data, and endpoint bond parameters. Processor 12 may also receive contour parameters associated with the bonding tool used to fabricate a semiconductor chip. This allows processor 12 to account for the individual characteristics of different bonding tools when generating image overlay 30.

In addition to generating image overlay 30, processor 12 populates template 28 with the video wire bond parameters programmed by the operator. Memory 20 receives and stores a completed or a partially populated template 28. This allows an operator to cease programming and recommence at a later time without contaminating template 28 or reconstructing any portion of template 28. Memory 20 also receives and stores image 26 of semiconductor device 23.

Display 18 displays image overlay 30 in combination with image 26 of semiconductor device 23, allowing an operator to program template 28 while simultaneously receiving visual feedback regarding the accuracy and integrity of each video wire bond. As a result, an operator need not complete an entire template 28 prior to analyzing it and discovering any potential manufacturing defects. Display 18 may also display magnified portions of the landscape of image 30 to provide the operator with a detailed field of view.

Figure 2:
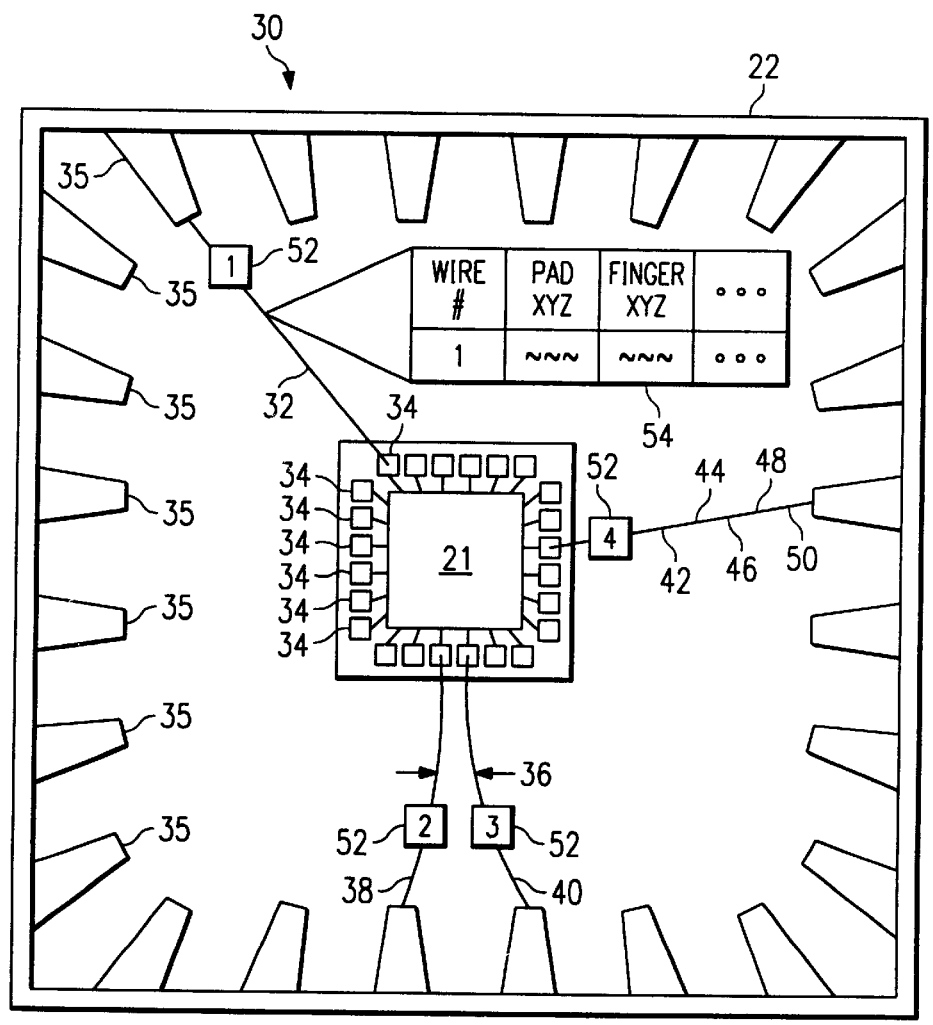
FIG. 2 illustrates one embodiment of an image overlay generated by the video wire bonder system.

FIG. 2 illustrates one embodiment of image overlay 30 generated by video wire bonder system 10. Image overlay 30 comprises a graphical representation of the video wire bond parameters programmed by the operator in combination with image 26 of semiconductor device 23 captured by imaging device 24, including semiconductor die 21 and associated lead frame 22. Semiconductor die 21 includes bonding pads 34 for connection to lead fingers 35 of lead frame 22. Displaying image 26 of an actual semiconductor device 23 allows the operator to program an accurate template 28 by accounting for any individual characteristics of device 23, the loading alignments and orientation of device 23 in imaging device 24, and other environmental and spatial factors expected during wire bonding. For example, using image 26 of an actual semiconductor device 23 allows an operator to accommodate for how a particular device 23 reacts to various manufacturing processes of a particular manufacturing device, including how a particular bonding tool maneuvers across the landscape of a particular device 23.

Image overlay 30 provides a visual image of a particular video wire bond 32 between bonding pad 34 and lead finger 35, without requiring the operator to physically bond a wire between these endpoints. This provides valuable visual feedback regarding the progression of the video wire bonds on semiconductor device 23, as well as the accuracy of each video wire bond, while the operator programs template 28. Access to this information prior to physically bonding each wire allows the operator to edit any design errors before programming the entire template 28 and without wasting time and valuable resources, such as silicon and bonding wire.

Many manufacturing devices employ a general wire bonding sequence to bond each wire without obstructing the path of a bonding tool associated with that manufacturing device. For example, some manufacturing devices bond wires from the corner bonding pads 34 prior to bonding wires from the middle bonding pads 34. Other sequences may be preferred based upon the particular characteristics of each manufacturing device and its associated bonding tool. Bonding wires out of a preferred sequence may cause the bonding tool to inadvertently disconnect an already bonded wire.

Accordingly, image overlay 30 illustrates with video overlay symbols 52 the video wire bonding sequence programmed by the operator and any deviations from a generally desired sequence. Providing visual feedback to an operator as to the programmed bonding sequence and any deviations from a desired sequence allows the operator to edit template 28 prior to physically bonding each wire. The desired video wire bonding sequence may also be indicated to the operator by video overlay symbols 52 prior to programming each successive video wire bond. That is, as each video wire bond is completed, the approximate position of the next desired video wire bond in the sequence can be represented on display 18 by symbols 52. The operator then accurately specifies the endpoints of the next video wire bond using input device 16.

In one embodiment, image overlay 30 provides a warning to an operator indicating an insufficient clearance 36 between a pair of video wires 38 and 40 video bonded on semiconductor device 23. The warning may materialize in response to an operator's query as to the clearance of a specific pair of wires, or may automatically appear upon detecting an insufficient clearance between a pair of wires, or between a wire and other features of semiconductor device 23. For example, processor 12 may detect that video wire 38 is too closely bonded to video wire 40, or that the proximity of wire 38 to wire 40 disallows a bonding tool to enter the space 36 between wires 38 and 40, in response to wire contour parameters and wire clearance parameters for each video wire. As a result, image overlay 30 illuminates wires 38 and 40 in a particular color, a pop-up warning appears, or some other suitable warning mechanism activates, notifying the operator of the insufficient clearance 36 between video wires 38 and 40. Consequently, an operator programming template 28 using the present invention may edit an offending video wire bond prior to physically completing the wire bonding sequence and testing the completed template 28 under laboratory conditions.

Image overlay 30 also illustrates the topology of each video wire bond by illuminating different sections 42, 44, 46, 48, and 50, of a wire corresponding to different elevations of a wire path. It should be understood that FIG. 2 depicts five elevation sections for illustrative purposes only, and that fewer or greater elevation sections may be illuminated by image overlay 30. For example, processor 12 monitors the contour and path of a particular video wire to evaluate whether that video wire bond satisfies elevation restrictions imposed by a particular semiconductor device 23, bonding tool, or manufacturing process. Image overlay 30 provides visual feedback to an operator regarding any deviations from the desired wire elevation by illuminating in a particular color those sections of the wire having different elevations, or by some other suitable means of indicating the topology of a video wire bond. An operator may edit an existing video wire bond of improper elevation, for example, to prevent a bonding tool from inadvertently disconnecting or destroying the wire during the manufacturing process.

An operator may query system 10 to retrieve information from processor 12 about any aspect of template 28 that the operator has programmed or is currently programming. For example, in response to a selection of a particular video wire bond, image overlay 30 displays wire positioning coordinates, wire identification data, or any other suitable video wire bond parameter associated with the selected wire, in a pop-up box 54 or other suitable presentation of information. Therefore, system 10 provides visual feedback to the operator about the accuracy and integrity of each video wire bond while the operator programs template 28.

FIG. 3 illustrates, in more detail, one embodiment of template 28 stored in memory 20. Template 28 organizes video wire bond parameters such as wire identification data 62, wire positioning coordinates 64, bonding sequence parameters 66, wire clearance parameters 68, and any other pertinent video wire bond parameter, in a file, table, chart, or other suitable organization of information. It should be understood that the coordinates provided in FIG. 3 are for illustrative purposes only. Memory 20 receives and stores template 28 in a file, stack, or other suitable organization of volatile or non-volatile memory. A manufacturing device creates a semiconductor chip patterned after template 28 by accessing template 28 and bonding each wire according to the associated video wire bond parameters.

System 10 allows an operator to edit the video wire bond parameters stored in template 28 without requiring the operator to physically reconstruct any portion of template 28. For example, after receiving visual feedback from image overlay 30, an operator may determine that a particular video wire bond is incorrect. Rather than programming a new template 28 from its inception, an operator may edit the existing template 28 to correct any defects by disconnecting an offending video wire on image overlay 30 and connecting it to a proper bonding pad 34 or lead finger 35. Reconnecting a video wire on image overlay 30 modifies wire positioning coordinates 64 associated with that wire and modifies template 28 to reflect any changes. An operator may also modify other video wire bond parameters by altering a wire path, elevation, or endpoint bond. The modified video wire bond parameters are updated in template 28 and graphically represented in image overlay 30 to provide simultaneous visual feedback to the operator.

Figure 4A:
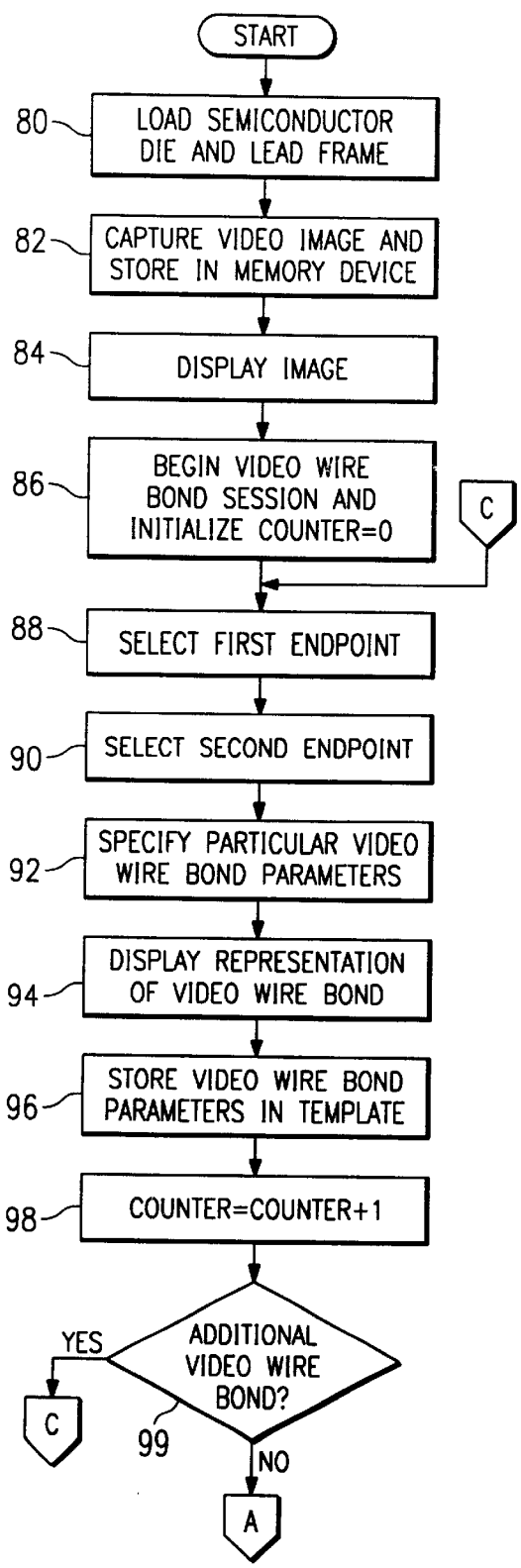
FIGS. 4A and 4B illustrate a flowchart of a method for generating the template of FIG. 3.
Figure 4B:
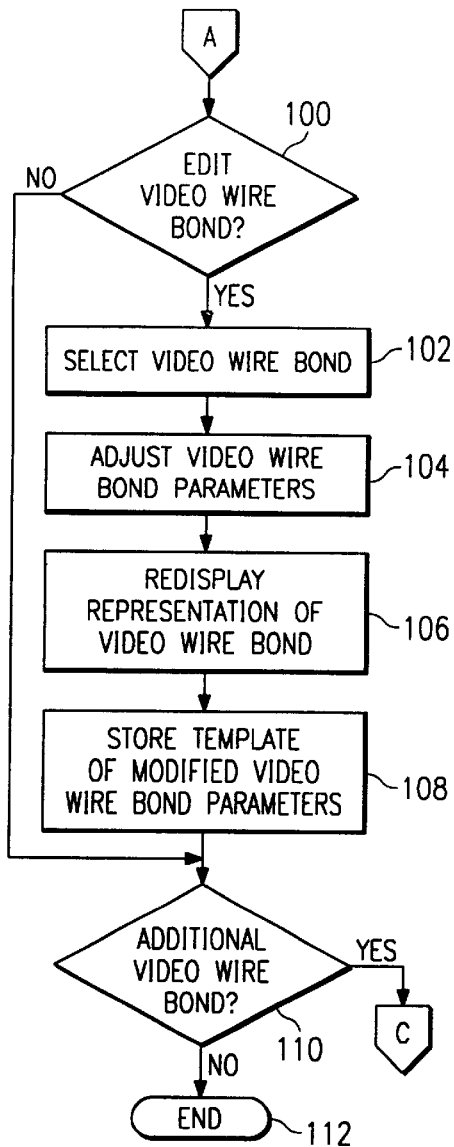

FIGS. 4A and 4B are flowcharts of an exemplary method for generating template 28 of FIG. 3. Referring to FIG. 4A, an operator loads a semiconductor device 23 into imaging device 24 of imaging station 14 at step 80. In a particular embodiment, device 23 is loaded at station 14 as if it was to be physically wire-bonded. Imaging device 24 captures image 26 of semiconductor device 23 and stores it in memory 20 at step 82. Display 18 displays image 26 at step 84. Imaging device 24 may magnify image 26 of semiconductor device 23 as well as pan the landscape of semiconductor device 23.

The operator begins a video wire bond session at step 86 and system 10 initializes to zero a counter to record the number and sequence of video wire bonds made by the operator. The operator manipulates input device 16 to select a first endpoint on semiconductor device 23, at step 88, and to select a second endpoint on semiconductor device 23, at step 90. Together, this selected pair of endpoints specifies a video wire bond. In addition to programming a video wire bond between two particular endpoints, the operator specifies particular video wire bond parameters for each video wire bond at step 92. For example, the operator selects a particular wire, defines a particular wire path contour or height, selects a particular type of wire bond at each endpoint, or specifies any other pertinent video wire bond parameter.

Display 18 displays a graphical representation of each video wire bond in image overlay 30 at step 94, and may also display the wire bonding sequence of a series of video wire bonds between selected endpoints on semiconductor device 23. In one embodiment, display 18 displays graphical representations of other video wire bond parameters. Display 18 may also display magnified portions of the landscape of image 30 to provide the operator with a detailed field of view. This allows the operator to program template 28 while simultaneously receiving visual feedback regarding the accuracy and integrity of each bond.

After each individual video wire bond is programmed, system 10 stores the associated video wire bond parameters, including the sequence number from the counter, in template 28, at step 96. System 10 increments by one the counter for each video wire bonded, at step 98. The operator determines whether to program an additional video wire bond at step 99. If so, execution returns to step 88 where the operator selects a first endpoint for the next video wire bond. If not, execution proceeds to step 100 of FIG. 4B.

FIG. 4B illustrates the operation of editing an existing video wire bond and begins at step 100, where the operator determines whether to edit an existing video wire bond. If not, execution proceeds to step 110. If so, the operator maneuvers input device 16 to select a particular video wire bond at step 102. The operator adjusts the desired video wire bond parameters associated with the selected video wire bond at step 104. Display 18 redisplays a graphical representation of the modified video wire bond in image overlay 30 at step 106. System 10 stores the modified wire bond parameters in template 28, at step 108. The operator determines whether to program an additional video wire bond at step 110. If so, execution returns to step 88 where the operator selects a first endpoint for the next video wire bond. If not, execution concludes at step 112.

Although the present invention has been described with several embodiments, a myriad of changes, variations, alterations, transformations, and modifications may be suggested to one skilled in the art, and it is intended that the present invention encompass such changes, variations, alterations, transformations and modifications as fall within the spirit and scope of the appended claims.

What is claimed is:

1. A system for programming a wire bonder comprising:
   a memory operable to store an image of a semiconductor die and an associated lead frame;
   an input device operable to specify a wire bond between the semiconductor die and the associated lead frame;
   a processor coupled to the memory and the input device and operable to generate an image overlay having a graphical representation of the wire bond, the semiconductor die, and the associated lead frame;
   a display coupled to the processor and operable to display the image overlay; and means for storing said coordinates and parameters in a bonder template, while viewing said display to confirm the suitability of said coordinates and parameters.

2. The system of claim 1, wherein the memory stores a plurality of wire positioning coordinates associated with the wire bond.

3. The system of claim 2, wherein the wire positioning coordinates associated with the wire bond comprise:
   a first endpoint specifying a position on a bonding pad of the semiconductor die; and
   a second endpoint specifying a position on a finger of the associated lead frame.

4. The system of claim 1, further comprising an imaging device operable to generate the image of the semiconductor die and the associated lead frame.

5. The system of claim 1, wherein the image overlay further comprises a graphical representation of a plurality of endpoint bond parameters.

6. The system of claim 1, wherein the image overlay further comprises a graphical representation of a plurality of wire clearance parameters.

7. The system of claim 1, wherein the image overlay further comprises a graphical representation of a plurality of bonding sequence parameters.

8. The system of claim 1, wherein the memory stores a plurality of bonding sequence parameters, a plurality of endpoint bond parameters, and a plurality of wire clearance parameters.

9. The system of claim 1, wherein the input device operates in response to operator instruction.

10. A method for programming a wire bonder comprising:
    receiving an image of a semiconductor die and an associated lead frame;
    specifying a wire bond between the semiconductor die and the associated lead frame;
    generating an image overlay having a graphical representation of the wire bond, the semiconductor die, and the associated lead frame; displaying the image overlay, to confirm the suitability of said coordinates and parameters; and storing said coordinates and parameters in a bonder program template.

11. The method of claim 10, further comprising the step of storing a plurality of wire positioning coordinates associated with the wire bond.

12. The method of claim 11, wherein the step of storing further comprises storing a plurality of bonding sequence parameters, a plurality of endpoint bond parameters, and a plurality of wire clearance parameters.

13. The method of claim 11, wherein the wire positioning coordinates associated with the wire bond comprise:
    a first endpoint specifying a position on a bonding pad of the semiconductor die; and
    a second endpoint specifying a position on a finger of the associated lead frame.

14. The method of claim 10, wherein the image overlay further comprises a graphical representation of a plurality of bonding sequence parameters, a plurality of endpoint bond parameters, and a plurality of wire clearance parameters.

15. The method of claim 10, wherein the step of specifying a wire bond between the semiconductor die and the associated lead frame further comprises:
    receiving operator instruction at an input device; and
    generating a plurality of wire positioning coordinates associated with the wire bond in response to the operator instruction.

16. The method of claim 10, wherein the step of specifying further comprises specifying a wire bond between the semiconductor die and the associated lead frame in response to operator instruction.

17. A system for programming a wire bonder comprising:

an imaging device operable to generate an image of a semiconductor die and an associated lead frame;

an input device operable to specify a wire bond between the semiconductor die and the associated lead frame in response to operator instruction;

a processor coupled to the input device and the imaging device and operable to generate an image overlay having a graphical representation of the wire bond, the semiconductor die, and the associated lead frame;

a memory coupled to the processor and operable to store a first endpoint and a second endpoint associated with the wire bond;

a display coupled to the processor and operable to display the image overlay; and means for completing the wire bonder program while the programmer views said display to confirm the suitability of bond coordinates and parameters.

18. The system of claim 17, wherein the memory stores the image of the semiconductor die and the associated lead frame.

19. The system of claim 17, wherein the memory stores a plurality of bonding sequence parameters, a plurality of endpoint bond parameters, and a plurality of wire clearance parameters.

20. The system of claim 17, wherein the image overlay further comprises a graphical representation of a plurality of bonding sequence parameters, a plurality of endpoint bond parameters, and a plurality of wire clearance parameters.

* * * * *